United States Patent
Qingyuan et al.

(10) Patent No.: US 6,834,656 B2
(45) Date of Patent: Dec. 28, 2004

(54) PLASMA PROCESS FOR REMOVING POLYMER AND RESIDUES FROM SUBSTRATES

(75) Inventors: Han Qingyuan, Columbia, MD (US); Carlo Waldfried, Falls Church, VA (US); Orlando Escorcia, Falls Church, VA (US); Gary Dahrooge, Germantown, MD (US); Ivan Berry, Ellicott City, MD (US)

(73) Assignee: Axcelis Technology, Inc., Beverly, MA (US)

( * ) Notice: Subject to any disclaimer, the term of this patent is extended or adjusted under 35 U.S.C. 154(b) by 127 days.

(21) Appl. No.: 09/864,003

(22) Filed: May 23, 2001

(65) Prior Publication Data

US 2002/0185151 A1 Dec. 12, 2002

(51) Int. Cl.⁷ .................................. B08B 7/04
(52) U.S. Cl. ..................... 134/1.3; 134/1.1; 134/26; 134/27; 134/30
(58) Field of Search .................. 134/1, 1.1, 1.2, 134/1.3, 26, 27, 30; 438/906

(56) References Cited

U.S. PATENT DOCUMENTS

| | | | |
|---|---|---|---|
| 5,057,187 A | * 10/1991 | Shinagawa et al. | 438/725 |
| 5,332,653 A | 7/1994 | Cullen et al. | 430/323 |
| 5,773,201 A | * 6/1998 | Fujimura et al. | 430/329 |
| 6,030,901 A | 2/2000 | Hopper et al. | 438/711 |
| 6,204,192 B1 | * 3/2001 | Zhao et al. | 438/723 |
| 6,242,350 B1 | * 6/2001 | Tao et al. | 438/690 |
| 6,316,354 B1 | * 11/2001 | Hu | 438/652 |
| 6,323,121 B1 | * 11/2001 | Liu et al. | 438/633 |
| 6,444,136 B1 | * 9/2002 | Liu et al. | 216/62 |
| 6,503,840 B2 | * 1/2003 | Catabay et al. | 438/694 |
| 6,521,547 B1 | * 2/2003 | Chang et al. | 438/781 |
| 6,528,426 B1 | * 3/2003 | Olsen et al. | 438/689 |

OTHER PUBLICATIONS

Hawley's Condensed Chemical Dictionary, pp. 750–751, 1993.*
Handbook of Organic Solvents, CRC Press, p. 399, 1995.*
Laura Peters, Senior Editor,"Low–k Dielectrics: Will Spin–On or CVD Prevail?" www.semiconductor.net., Jun. 2000.

* cited by examiner

Primary Examiner—Alexander Markoff
(74) Attorney, Agent, or Firm—Cantor Colburn LLP

(57) ABSTRACT

A process for removing polymers formed during etching and etch residues from a semiconductor substrate by exposing the substrate to plasmas of neutral chemistry. The plasma generates atomic hydrogen species and atomic oxygen species in about equal amounts that react with and remove the polymers and etch residues from the substrate. The process is especially suitable for use with semiconductor substrates comprising low k dielectric materials and/or copper interconnects.

21 Claims, 2 Drawing Sheets

PLASMA PROCESS FOR REMOVING POLYMER AND RESIDUES FROM SUBSTRATES

TECHNICAL FIELD

The present invention relates to plasma processing, and, more particularly, relates to plasma processes for removing polymers formed during etching and etch residues from substrates by exposing the polymers and residues to plasmas of a neutral chemistry.

BACKGROUND

For semiconductor chip manufacturing, it is necessary to thoroughly remove polymers formed during etching as well as any etch residues. Polymer formation during etching is a well-known phenomenon and in some cases, is deliberately used to passivate sidewalls of certain features during the etching process. Etch residues are byproducts deposited onto the substrate surface during the etching process and are a significant source of defects in the manufacturing process.

During sidewall passivation, some of the etchants (e.g., chlorine) and etched materials from the etched layers (e.g., materials from an interlayer dielectric layer or a metallization layer, photoresist, among others) may become absorbed into the polymer deposition formed along sidewalls or into the etch residues deposited elsewhere on the substrate. The polymer deposition along sidewalls and etch residues may thus become impregnated with inorganic and organic materials including, for example, $Cl_2$, $SiO_2$, Si, carbon, Ti, Al, and the like. For example, an organic photoresist mask is commonly used to protect selected areas of the substrate from etching. However, some photoresist erosion takes place in addition to the etching of the substrate in the exposed areas. Some of this eroded photoresist material may become deposited along the sidewalls of various features, for example, an interconnect line, thereby passivating the sidewalls with polymers. In general, the passivation of the sidewalls is not necessarily undesirable. Sidewall passivation has been known to assist in maintaining profile control during etching and to prevent the etchant from undercutting the etched features, among others. The polymers formed during etching may also contain fluorinated constituents. Fluorine is believed to come from, among other sources, the liner in the etching chamber.

After etching, it is typically necessary to remove the overlying photoresist mask along with any polymer deposition and etch residues formed during the etching process. Conventionally, the photoresist removal is achieved by use of plasma stripping and optional DI water rinse processes subsequent to etching. In the plasma stripping process step, oxygen and forming gas (3–5% $H_2/N_2$) in a plasma state are commonly used to remove the photoresist and as much of the polymers and residues as possible. The rinse step is used to further remove polymers and to further dilute any corrosive gases, such as chlorine, that has been absorbed into the polymer sidewalls. A problem that arises is that the absorbed inorganic and organic materials cause difficulty in removing the polymers formed on sidewalls and etch residues during the subsequent photoresist strip and rinse processes. As a result, the potential for defects that impact device yield exists.

As previously noted, in the past, stripping the photoresist mask material and the polymers and etch residues formed during etching has been achieved with oxygen-based plasma technologies. Oxygen-based plasmas are fairly aggressive and have been successfully used to effectively remove these materials. However, a problem with oxygen-based plasmas is that they are generally unsuitable for use with substrates including copper and low k dielectric materials. In the presence of oxygen-based plasmas, copper readily oxidizes which detrimentally affects processing capabilities for the fabricated circuit. Moreover, for substrates utilizing low k dielectric materials, the use of oxygen-based plasmas is too aggressive and difficult to control. Low k dielectric materials typically comprise organic polymers similar to those found in the photoresist making the etching/stripping selectivity of photoresist to low k materials close to unity. That is, the low k dielectric materials are removed at roughly the same rate as photoresist.

More recently, oxygen-free plasmas or hydrogen reducing plasmas have been developed for use with devices employing copper metal and/or low k dielectric materials for selectively removing the photoresist as well as the polymers and residues formed during etching. These plasmas are less aggressive than oxygen-containing plasmas and typically are formed from mixtures containing forming gas and/or fluorine gas. Forming gases are oxygen-free gas mixtures comprised of hydrogen gas and an inert gas. The reducing plasmas, with no reactive oxygen species, generate a large amount of reactive hydrogen species that react with the photoresist for removal. Oxygen-free and reducing plasmas are generally effective for photoresist removal but may result in unfavorable surface conditions that are not suitable for the subsequent metal fill processes. Moreover, the use of reducing plasmas do not efficiently and completely remove all of the polymers and residues formed during prior etching processes.

There accordingly remains a need in the art for a plasma process that is effective for removing all of the polymers and etch residues formed during etching without deleteriously affecting the performance characteristics of the integrated circuit.

SUMMARY OF THE INVENTION

A post etch process for removing residues and polymer formed during an etching process from a semiconductor substrate. The process includes exposing the substrate having the residues and polymer thereon to plasma having a neutral chemistry for a period of time effective to substantially remove the polymer and residue from the substrate. Preferably, the semiconductor substrate includes at least one low k dielectric layer. The low k dielectric has a dielectric constant less than 3.0 and is preferably selected from the group consisting of polyimides, benzocyclobutenes, parylenes, fluorocarbons, nanoglasses, aerogels, hydrogen silsesquioxanes, nanoporous oxides, and carbon doped silicon dioxides.

The plasma of neutral chemistry includes approximately equal amounts of atomic hydrogen species and atomic oxygen species. The plasma may further contain atomic fluorine species. The atomic hydrogen species are generated from a hydrogen-bearing compound. Hydrogen bearing compounds include a hydrogen gas, a hydrogen gas mixture, hydrocarbons, hydrofluorocarbons, water vapor and mixtures thereof. The atomic hydrogen and oxygen species react with and remove the polymers and etch residues from the substrate.

The post etch process may include exposing the substrate to a plasma stripping process effective to remove a photoresist material from the substrate prior to or after exposing the substrate having the residues and polymer thereon to plasma having a neutral chemistry for a period of time effective to substantially remove the polymer and residue from the substrate.

DETAILED DESCRIPTION OF THE PREFERRED EMBODIMENTS

The present invention generally provides a post etch process for removing polymers and etch residues formed during etching from a surface of a semiconductor substrate. Preferably, the process is used with substrates including low k dielectric materials and/or copper metal layers. In particular, the process includes exposing the semiconductor surface to plasma of neutral chemistry. The process may be independently performed or alternatively, may be integrated with a photoresist stripping process. In the event that the process is integrated with the photoresist stripping process, the inventive process may be performed before or after the photoresist stripping process. The inventive process has been found to effectively and efficiently remove the polymers and etch residues formed during etching without deleteriously affecting any of the materials used in the substrate and/or the profiles contained therein.

The particular polymers formed on the sidewalls during etching are dependent on the etching chemistry and/or treatment steps utilized. For example, U.S. Pat. No. 5,332,653 to Cullen et al. entitled, "Process for Forming a Conductive Region without Photoresist-related Reflective Notching Damage" discloses a process for protecting sidewall surfaces for features during etching. The process includes exposing portions of the photoresist layer to an ion bombardment environment effective to harden a sidewall surface of the photoresist material. Ion bombardment chemically changes the photoresist material and forms a polymeric material that is more difficult to remove in subsequent etching and stripping processes.

The etch residues include, but are not limited to, residual photoresist, chemically modified photoresist resulting from reaction with any prior processing steps such as etching and ion implantation, residues deposited from the etching chamber during etching, sidewall depositions and any materials deposited or formed on the substrate during any prior processing steps.

Figure 1:
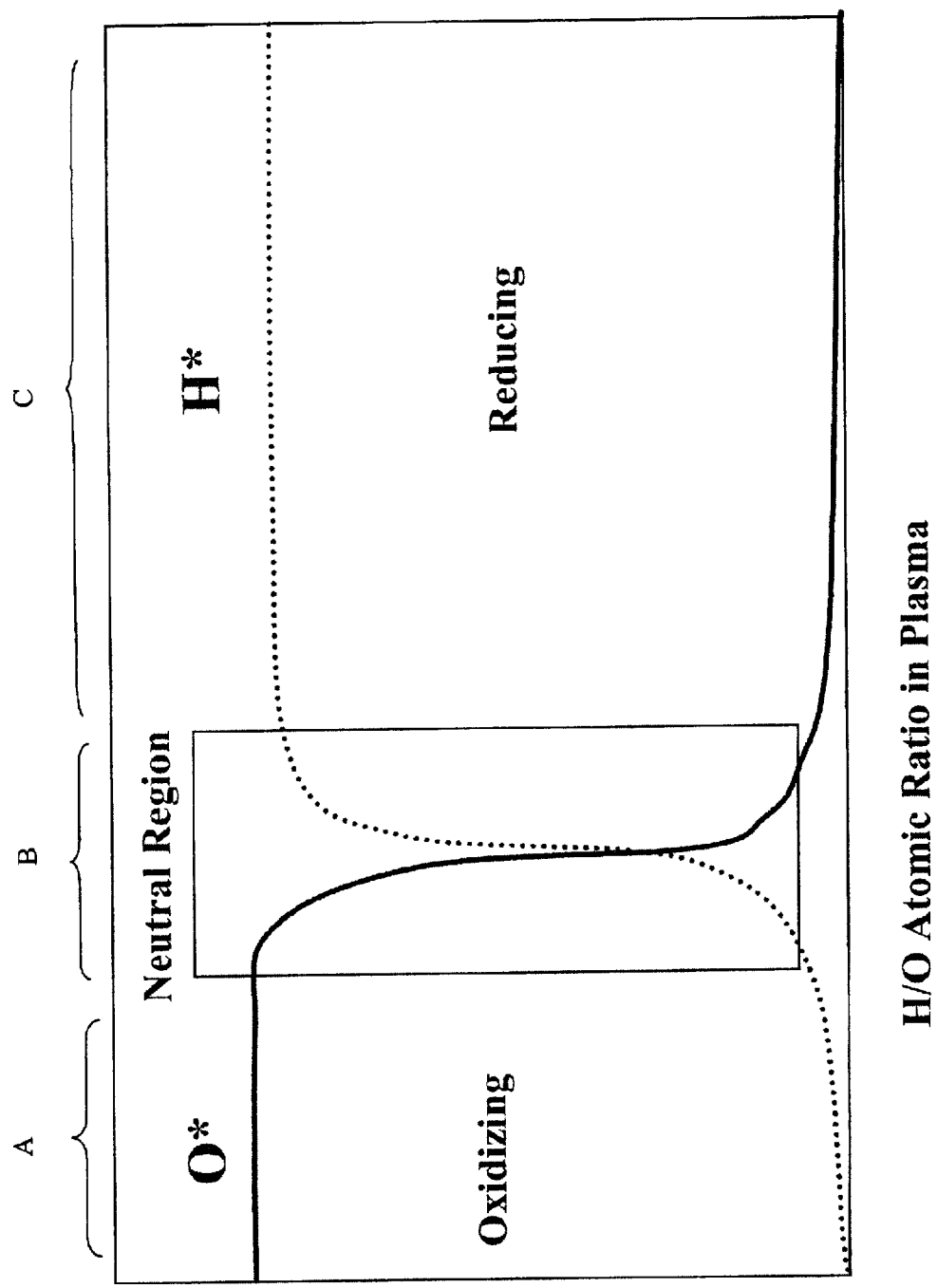
FIG. 1 is a graph in logarithmic scale showing the ratios of hydrogen and oxygen species for oxidizing, neutral and reducing plasmas.

Referring now to FIG. 1, there is shown a graph in logarithmic scale showing the levels of atomic oxygen and hydrogen in a plasma as the oxygen to hydrogen ratio in the feed gas is changed. Regions where the resulting plasma is oxidizing, neutral or reducing are labeled accordingly. In region A, the number of atomic oxygen species generated by the plasma is significantly greater than the number of atomic hydrogen species and is characterized as a plasma of oxidizing chemistry. This region is favored for photoresist ashing and may lead to successful polymer removal but, is subject to potential material damage to the underlayers especially when low k dielectric materials and copper interconnects are present. Region B includes plasmas of neutral chemistry comprised of approximately equal amounts of atomic hydrogen and oxygen species. Region C includes plasmas of reducing chemistry; the amounts of atomic hydrogen species significantly outnumber the amounts of atomic oxygen species. Exposing a substrate to plasmas of neutral chemistry has been found to effectively remove polymers formed during etching and etch residues without deleteriously affecting the substrate. In contrast, exposing the substrate to oxidizing or reducing plasmas do not efficiently remove the polymers/residues and/or deleteriously affects the substrate.

The present invention is applicable to removing those polymers formed during etching and etch residues formed from photoresist materials used in g-line, I-line, DUV, 193 nm, 157 nm, e-beam technologies and the like. The photoresists are generally organic films cast from solvent and used for the transfer of images to an underlying surface. The coated photoresist is primarily comprised of a polymer such as for example, novolaks, polyvinylphenols, acrylates, cyclic olefins and the like. The remainder of the coated photoresist material may comprise dyes, photoacid generators, photoactive components, surfactants, residual solvent and speed modifiers. Other photoresist polymers and additional components suitable for photoresist materials will be apparent to those skilled in the art in view of this disclosure. During etching and ion implantation processes, the photoresist may react with the etching chemistries and/or ions to form strip resistant residues. Exposing these residues to plasma of neutral chemistry is effective for removal.

The neutral chemistry of the plasma is formed from approximately equal amounts of atomic oxygen species and atomic hydrogen species. The atomic oxygen species are typically generated from a gas mixture containing oxygen gas that generates atomic oxygen species under plasma forming conditions. Likewise, the atomic hydrogen species may be generated from hydrogen bearing compounds or hydrogen gas under similar plasma forming conditions. The hydrogen bearing compounds include those compounds that contain hydrogen, for example, hydrocarbons, hydrofluorocarbons, hydrogen gas, water vapor or hydrogen gas mixtures. The hydrogen bearing compounds used are ones that generate sufficient atomic hydrogen species to increase removal selectivity of the polymers formed during etching and etch residues.

Particularly preferred hydrogen bearing compounds are those that exist in a gaseous state and release hydrogen to form atomic hydrogen species such as free radical or hydrogen ions under plasma forming conditions. The gas may be a hydrocarbon that is unsubstituted or may be partially substituted with a halogen such as bromine, chlorine, or fluorine, or with oxygen, nitrogen, hydroxyl and amine groups. Examples of suitable hydrogen bearing gases include methane, ethane, ammonia and propane.

The hydrogen gas is preferably in the form of a gas mixture. Preferred hydrogen gas mixtures are those gases that contain hydrogen gas and an inert gas. Examples of suitable inert gases include argon, nitrogen, neon, helium and the like. Especially preferred hydrogen gas mixtures are so-called forming gases that consist essentially of hydrogen gas and nitrogen gas. Particularly preferred is a forming gas wherein the hydrogen gas ranges in an amount from about 1 percent to about 5 percent by volume of the total forming gas composition. Although amounts greater than 5 percent can be utilized, safety becomes an issue due to risk of explosion of the hydrogen gas.

Preferably, the atomic hydrogen and oxygen species are generated from a gas mixture including an oxygen gas and a forming gas. Equally preferable, the atomic hydrogen and oxygen species are generated from a gas mixture including oxygen gas, a forming gas and a water vapor. More preferably, the gas mixture under plasma forming conditions generates about equal amounts of atomic hydrogen species and atomic oxygen species. It is well within the skill of those in the art to determine the proper gas ratios.

The low k dielectric materials used in advanced integrated circuits typically comprise organic polymers and have dielectric constants less than about 3.0. The low k dielectric materials can be spun onto the substrate as a solution or deposited by a chemical vapor deposition process. Important low k film properties include thickness and uniformity, dielectric constant, refractive index, adhesion, chemical resistance, thermal stability, pore size and distribution, coefficient of thermal expansion, glass transition temperature, film stress and copper diffusion coefficient. Low k dielectrics can be generally classified as one of three types: organic, porous and doped oxides. Organic low k dielectric materials include polyimides, benzocyclobutene, parylenes and fluorocarbons. An example of a commercially available organic dielectric is a spin-on aromatic hydrocarbon referred to by the trademark SILK® and commercially available from Dow Chemical. SILK® contains no fluorine or silicon and has a reported dielectric constant of 2.6 to 2.8. Examples of porous low k dielectric materials include nanoglass and aerogels. Examples of doped oxide low k dielectric materials include hydrogen-doped oxides, e.g., hydrogen silsesquioxanes (HSQ), fluorine-doped oxides, e.g., fluorinated silicate glass (FSG) and carbon-doped oxides. A spin-on HSQ is commercially available from Dow Corning under the trademark FOx®. FOx® is reported to have a dielectric constant of 2.6 to 3.0. Other low k dielectric materials will be apparent to those skilled in the art in view of this disclosure.

The process can be practiced in conventional plasma ashers. The invention is not intended to be limited to any particular plasma asher. For example, a plasma asher employing an inductively coupled plasma reactor could be used or a downstream plasma asher could be used. Preferably, the plasma asher is a downstream plasma asher, such as for example, microwave plasma ashers commercially available under the trade name Fusion GEMINI ES from the Axcelis Corporation in Rockville, Md.

The removal process can be practiced prior to or after a stripping process has been completed to remove the photoresist mask or can be integrated with the photoresist stripping process to maximize wafer throughput. Preferably, the wafer is heated during the removal process to accelerate the reaction with the atomic species generated by the plasma of neutral chemistry. Preferably, the wafers are heated to a temperature between room temperature and 450° C. The temperatures used during processing may be constant or alternatively, ramped or stepped during processing. Preferably, the pressure within the reaction chamber is reduced to about 1 torr or more. More preferably, the pressure is maintained between about 1 torr and about 6 torr. An excitable gas mixture is fed into a plasma-generating chamber via a gas inlet. The gas mixture is exposed to an energy source within the plasma-generating chamber, e.g., microwave energy preferably between about 500 W and 4000 W, to generate excited or energetic atoms from the gas mixture. Preferably, the gas mixture includes an oxygen containing gas and a hydrogen bearing gas. Optionally, the gas mixture may further include other gases such as a fluorine bearing gas. The flow ratios for the various gases are optimized such that the plasma-generating chamber generates plasma having a neutral chemistry (region B as shown in FIG. 1). Preferably, the total gas flow rate is from about 2000 to 3500 sccm for a 200 mm downstream plasma asher. Fluorine added to the mixture is preferably at a flow rate from 0 to 500 sccm based on the total gas flow rate. Optionally, water vapor may be added to the plasma. In the event water vapor is added to the plasma, the ratios of oxygen/forming gas will need to be adjusted since the water vapor generates a greater amount of atomic hydrogen species than atomic oxygen species. The excited or energetic atoms are fed into the reaction chamber. The polymers and residues are selectively removed from the wafer by reaction with the excited or energetic atoms of the neutral chemistry. The settings and optimization for particular plasma ashers will be well within the skill of those in the art in view of this disclosure.

The following examples fall within the scope of, and serve to exemplify, the more generally described methods set forth above. The examples are presented for illustrative purposes only, and are not intended to limit the scope of the invention.

EXAMPLES

Example 1

In this example, a fluoropolymer was coated onto three sets of two wafers. The fluoropolymer was chosen since it has been determined that polymers and residues formed after etching processes typically contain fluorine and are generally difficult to remove using current conventional processes. The wafers for each set had deposited or coated thereon an underlayer comprised of a SILK low k dielectric film or an oxide layer or a nitride layer. Each set of wafers was exposed to plasma of neutral chemistry generated in a Fusion GEMINI ES downstream plasma asher. The process conditions are set forth in table I. The results are shown in table II.

TABLE I

| Step | Time (sec) | Pressure (torr) | Temp (° C.) | Power (watts) | $O_2$ (sccm) | 5% $H_2/N_2$ (sccm) | $CF_4$ (sccm) |
| --- | --- | --- | --- | --- | --- | --- | --- |
| 1 | 30 | 3.5 | 220 | 1500 | 1000 | 1000 | 50 |
| 2 | 45 | 3.5 | 220 | 1500 | 1000 | 1000 | 50 |

TABLE II

| Wafer Set | Wafer Film Type | Film Loss (Angstroms) |
| --- | --- | --- |
| 1 | SILK | 52 |
| 1 | SILK | 56 |
| 2 | Oxide | 8 |
| 2 | Oxide | 7 |
| 3 | Nitride | 7 |
| 3 | Nitride | 7 |

Exposing the fluoropolymer to plasma of neutral chemistry efficiently removed all traces of the fluoropolymer film. Moreover, the results shown in Table II demonstrate that minimal removal of the underlying film type occurred. Although selectivity over the various wafer film types appears to be exceptional, the process was not optimized for removal selectivity over each particular wafer film type and further improvements can be expected.

Example 2

In this example, patterned wafers were exposed to plasma of neutral chemistry. A FOx low k dielectric layer was spun onto the wafer surface. Then, a layer of photoresist was coated onto the dielectric and a pattern was formed in the wafer using conventional photolithographic techniques. Vias were etched and patterned into the wafer. The remaining photoresist was plasma stripped using a conventional plasma stripping processes. Under microscopic evaluation, it was observed that the plasma stripping process did not remove all of the polymers formed during etching and etch residues. The wafers were then exposed to plasma of neutral chemistry. The process conditions are set forth in table III. Inspection of the wafers showed complete removal of the polymers and etch residues. Minimal or no profile degradation was observed.

TABLE III

| Time (secs) | Pressure (torr) | Temp. (° C.) | Power (watts) | 3% $H_2/N_2$ (sccm) | $CF_4$ (sccm) | $O_2$ (sccm) | $H_2O$ (sccm) |
|---|---|---|---|---|---|---|---|
| 15 | 3 | 300 | 1800 | 1000 | 100 | 1000 | 0 |
| 90 | 3 | 300 | 1800 | 1000 | 100 | 1000 | 0 |
| 30 | 1 | 350 | 2000 | 3000 | 200 | 0 | 450 |

Example 3

Figure 2:
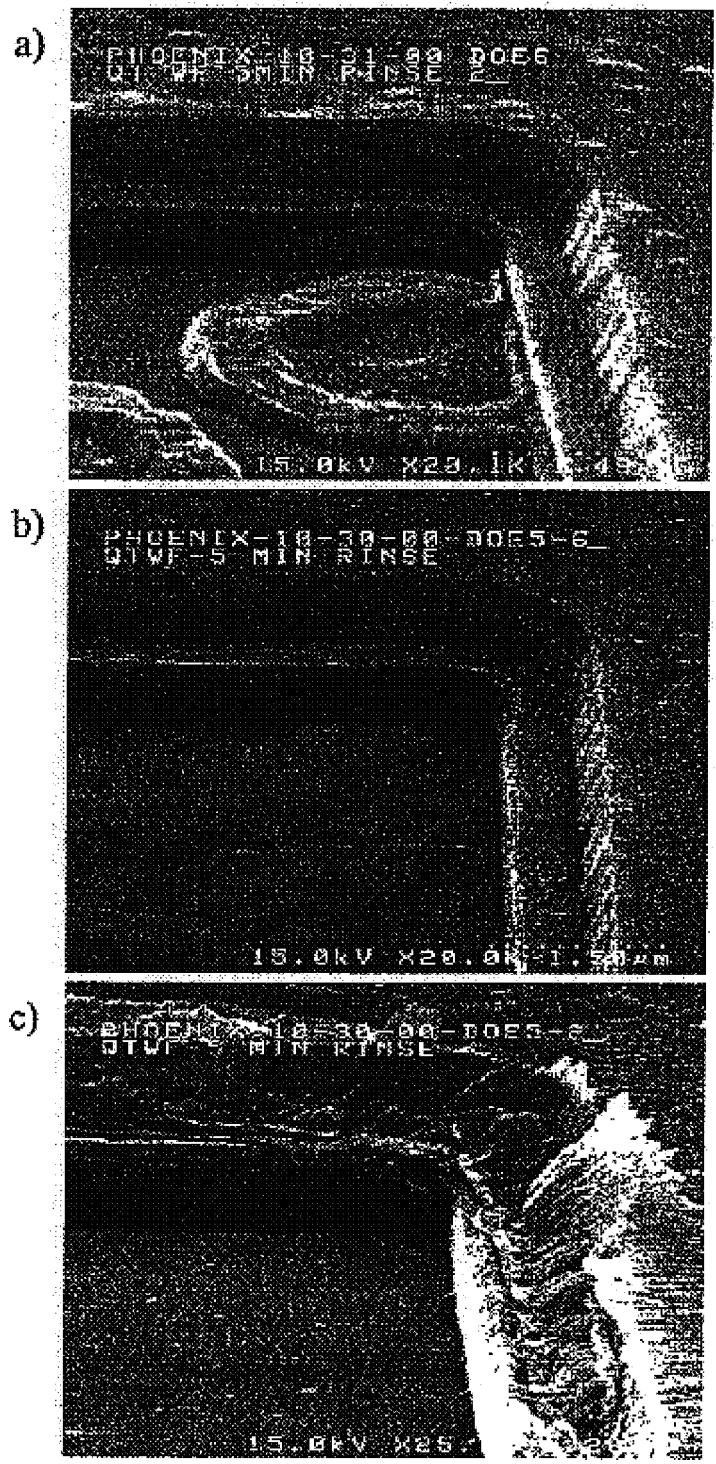
FIG. 2 is scanning electron microscopy photomicrographs showing perspective views of a substrate surface after exposure to: a) reducing plasma, b) neutral plasma and c) oxidizing plasma

In this example, photoresist was removed from wafers using plasmas of oxidizing, neutral and reducing chemistry. The wafers contained oxide or oxynitride dielectric passivation layers. The process conditions for the various plasmas are set forth in Table IV. The total flow of the gas mixture was maintained at 3500 sccm. The oxygen gas to forming gas ratio was varied from 1.0, 1.4 and 2.0. Water vapor was added to the gas mixtures. The results are shown in FIGS. 2A–C. FIG. 2A shows the results using plasma of reducing chemistry, i.e., the oxygen gas to forming gas ratio was 1.0 resulting in the generation of a greater amount of atomic hydrogen species than atomic oxygen species (water vapor was added to the gas mixture and affects the gas ratios). The polymers are clearly not removed by exposure to the reducing plasma. FIG. 2B shows the results of exposing the wafer to plasma of neutral chemistry. The process removed all of the polymers and etch residues formed during etching without affecting the underlying feature profiles. The ratio of oxygen gas to forming gas was 1.4 with water vapor added resulting in the generation of a about equal amounts of atomic hydrogen species and atomic oxygen species. FIG. 2C shows the effects of exposing the wafer to plasma of oxidizing chemistry. The ratio of oxygen gas to forming gas was 2.0 with water vapor added resulting in the generation of a greater amount of atomic oxygen species than atomic hydrogen species. Although the polymers appear to be removed, it can be seen that residues are still on the surfaces. More importantly, the underlying profiles have been severely degraded.

TABLE IV

| Time (secs) | Pressure (torr) | Temp. (° C.) | Power (watts) | 3% $H_2/N_2$ (sccm) | $O_2$ (sccm) | $CF_4$ (sccm) | $H_2O$ (sccm) |
|---|---|---|---|---|---|---|---|
| 15 | 2 | 250 | 1800 | varied | varied | 100 | 30 |
| 180 | 2 | 250 | 1800 | varied | varied | 100 | 30 |

Example 4

In this example, a defect analysis of wafers exposed to plasmas of neutral chemistry was made for a tungsten metal via fill. One set of wafers was exposed to plasmas of neutral chemistry and included process steps 1–4, as shown in table V. A second set of wafers was exposed to plasma of reducing chemistry and included process steps 1 and 2 only. The vias were subsequently filled with tungsten using a conventional chemical vapor deposition process.

TABLE V

| Step | Time (seconds) | Pressure (torr) | Temp. (° C.) | Power (watts) | $O_2$ (sccm) | 5% $H_2/N_2$ (sccm) | $CF_4$ (sccm) |
|---|---|---|---|---|---|---|---|
| 1 | 15 | 1.2 | 240 | Off | 0 | 2000 | 5 |
| 2 | 60 | 1.2 | 240 | 1200 | 0 | 2000 | 5 |
| 3 | 5 | 3.0 | 240 | 1500 | 1000 | 1000 | 20 |
| 4 | 25 | 3.0 | 240 | 1500 | 1000 | 1000 | 20 |

The results showed that wafers exposed to plasma of neutral chemistry had less than 10 defects per wafer. In contrast, the wafers exposed to the reducing plasma exhibited tungsten fill defects greater than 100 defects per wafer. As a result, significant yield improvements are expected for wafers exposed to plasma of neutral chemistry for removing polymers and etch residues formed during etch.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A post etch process for removing residues and polymers formed during an etching process from a semiconductor substrate, the process comprising:

exposing the substrate having the residues and the polymers thereon to plasma having a neutral chemistry for a period of time effective to substantially remove all of the polymers and residues from the substrate, wherein the neutral chemistry comprises about equal amounts of atomic oxygen species and atomic hydrogen species.

2. The post etch process according to claim 1, wherein the semiconductor substrate comprises at least one low k dielectric layer.

3. The post etch process according to claim 1 further comprising exposing the substrate to plasma having an oxidizing chemistry for a period of time effective to substantially remove all of a photoresist layer.

4. The post etch process according to claim 3, wherein exposing the substrate to plasma having the oxidizing chemistry is prior to exposing the substrate to the plasma having the neutral chemistry.

5. The post etch process according to claim 3, wherein exposing the substrate to plasma having the oxidizing chemistry is subsequent to exposing the substrate to the plasma having the neutral chemistry.

6. The post etch process according to claim 1 further comprising exposing the substrate to plasma having a reducing chemistry for a period of time effective to substantially remove all of a photoresist layer.

7. The post etch process according to claim 6, wherein exposing the substrate to plasma having the reducing chemistry is prior to exposing the substrate to the plasma having the neutral chemistry.

8. The post etch process according to claim 6, wherein exposing the substrate to plasma having the reducing chemistry is subsequent to exposing the substrate to the plasma having the neutral chemistry.

9. The post etch process according to claim 1, wherein the neutral chemistry further comprises atomic fluorine species.

10. A microelectronic device prepared by the process of claim 1.

11. The post etch process according to claim 1, wherein the atomic hydrogen species are generated from a forming gas comprising a hydrogen gas and an inert gas.

12. A process for removing polymers and etch residues formed during etch from a wafer having a surface therein comprising a low k dielectric material, the process comprising:

heating the wafer;

flowing a gas mixture comprising an oxygen gas and a hydrogen bearing compound;

generating a plasma from the mixture to form atomic oxygen species and atomic hydrogen species;

exposing the wafer surface to the atomic species, wherein an amount of the atomic oxygen species is about equal to an amount of the atomic hydrogen species;

reacting the atomic species with the polymers and residues to substantially remove the polymers and residues from the surface.

13. The process according to claim 12, wherein the wafer is heated to a temperature ranging from about room temperature to about 450° C.

14. The process according to claim 12, further comprising maintaining a pressure of less than about 6 torr.

15. The process according to claim 12, wherein the gas mixture further comprises a fluorine bearing gas.

16. The process according to claim 12, wherein the gas mixture further comprises water vapor.

17. The process according to claim 12, wherein the hydrogen bearing compound is selected from the group consisting essentially of a hydrogen gas, a water vapor, a hydrocarbon, a hydrofluorocarbon, a hydrogen gas mixture and mixtures thereof.

18. The process according to claim 17, wherein the hydrogen gas mixture comprises a forming gas comprising hydrogen gas and an inert gas, wherein the hydrogen gas is in an amount ranging from about 1 percent to about 5 percent by volume of the forming gas.

19. A microelectronic device prepared by the process of claim 12.

20. A post etch process for removing residues and polymers formed during an etching process from a semiconductor substrate, the process comprising:

exposing the substrate having the residues and the polymers thereon to plasma having a neutral chemistry for a period of time effective to substantially remove all of the polymers and residues from the substrate, wherein the neutral plasma is generated from a gas mixture comprising a forming gas composition with a hydrogen gas concentration less than about 5 percent by volume of the total forming gas composition, wherein the neutral plasma comprises about equal amounts of atomic oxygen species and atomic hydrogen species.

21. A post etch process for removing residues and polymers formed during an etching process from a semiconductor substrate, the process comprising:

exposing the substrate having the residues and the polymers thereon to a microwave generated plasma having a neutral chemistry for a period of time effective to substantially remove all of the polymers and residues from the substrate, wherein the neutral chemistry comprises about equal amounts of atomic oxygen species and atomic hydrogen species.

* * * * *